(12) United States Patent
Nicolas et al.

(10) Patent No.: US 10,979,063 B2
(45) Date of Patent: Apr. 13, 2021

(54) ELECTRONIC CIRCUIT WITH A SET OF WEIGHTED CAPACITANCES

(71) Applicant: STMicroelectronics (Grenoble 2) SAS, Grenoble (FR)

(72) Inventors: Sandrine Nicolas, Saint Egreve (FR); Damien Giot, Grenoble (FR); Serge Ramet, Jarrie (FR); Reiner Welk, Sassenage (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 16/862,297

(22) Filed: Apr. 29, 2020

(65) Prior Publication Data
US 2020/0366308 A1  Nov. 19, 2020

(30) Foreign Application Priority Data
May 13, 2019 (FR) ........................................ 1904920

(51) Int. Cl.
*H03M 1/38* (2006.01)
*H03M 1/12* (2006.01)
*H03M 1/44* (2006.01)

(52) U.S. Cl.
CPC ................ *H03M 1/38* (2013.01); *H03M 1/12* (2013.01); *H03M 1/442* (2013.01)

(58) Field of Classification Search
CPC ........... H03M 1/38; H03M 1/442; H03M 1/12
USPC ........................................ 341/161, 155, 144
See application file for complete search history.

(56) References Cited

U.S. PATENT DOCUMENTS

| | | | |
|---|---|---|---|
| 6,614,645 B1 | 9/2003 | Sakurai et al. | |
| 9,991,331 B2* | 6/2018 | Kondo | H01L 23/528 |
| 10,529,496 B1* | 1/2020 | Cho | H01G 2/06 |
| 10,622,366 B2* | 4/2020 | Chavan | H01L 27/11507 |
| 10,643,985 B2* | 5/2020 | Cheng | H01L 28/40 |
| 2005/0017321 A1 | 1/2005 | Hakkarainen et al. | |
| 2018/0358427 A1 | 12/2018 | Lan et al. | |

* cited by examiner

*Primary Examiner* — Brian K Young
(74) *Attorney, Agent, or Firm* — Slater Matsil, LLP

(57) ABSTRACT

An electronic circuit comprises capacitive structures that are connected to one or a plurality of nodes, where each of the capacitive structures is formed by a capacitor or by a plurality of capacitors electrically connected in parallel. The electronic circuit further comprises additional capacitors that are each connected to the one or plurality of nodes. For at least one distance between capacitors, the capacitive structures have a same average of values defined, for each capacitor of each capacitive structure, by the number of capacitors of the circuit connected to the one or plurality of nodes and located at the distance from the capacitor of the capacitive structure.

24 Claims, 5 Drawing Sheets

ELECTRONIC CIRCUIT WITH A SET OF WEIGHTED CAPACITANCES

CROSS-REFERENCE TO RELATED APPLICATIONS

This application claims priority to French Patent Application No. 1904920, filed on May 13, 2019, which application is hereby incorporated herein by reference.

TECHNICAL FIELD

The present disclosure generally relates to electronic circuits, more particularly electronic circuits comprising weighted-capacitance capacitors, particularly analog-to-digital converters with weighted-capacitance capacitors.

BACKGROUND

Certain circuits comprise weighted-capacitance capacitors, that is, capacitive structures having capacitance values equal to a same unit value multiplied by integer coefficients. In particular, in an analog-to-digital converter, the digital value output by the converter is a function of the weighted capacitance values. The accuracy of the conversion is thus linked to the accuracy of the weighted capacitance values obtained in practice.

SUMMARY

There is a need to improve the accuracy of the weighted capacitance values of an electronic circuit.

There is a need to decrease the bulk of an electronic circuit comprising weighted-capacitance capacitors.

An embodiment overcomes all or part of the disadvantages of known circuits comprising weighted-capacitance capacitors.

An embodiment provides a circuit comprising weighted-capacitance capacitors having a smaller bulk and/or more accurate capacitance values than known weighted-capacitance capacitors.

Thus, an embodiment provides an electronic circuit, wherein: capacitive structures are connected to one or a plurality of nodes, each of the capacitive structures being formed by a capacitor or by a plurality of capacitors (200) electrically connected in parallel; additional capacitors are each connected to said one or plurality of nodes; and for at least one distance between capacitors, the capacitive structures have a same average of values defined, for each capacitor of each capacitive structure, by the number of capacitors of the circuit connected to said one or plurality of nodes and located at said distance from the capacitor of the capacitive structure.

According to an embodiment, the capacitors of the capacitive structures and the additional capacitors are capacitor units.

According to an embodiment, the capacitors of the capacitive structures and the additional capacitors are located in locations of an array.

According to an embodiment, the capacitors of the capacitive structures occupy all the locations of a central portion of the array, and the additional capacitors occupy all the locations adjacent to said central portion.

According to an embodiment, said at least one distance comprises a distance between neighboring capacitors of a column of the array and/or a distance between neighboring capacitors of a row of the array.

According to an embodiment, said at least one distance is a same distance between neighboring capacitors of a row of the array and between neighboring capacitors of a column of the array.

According to an embodiment, the capacitive structures are switchable.

According to an embodiment, the capacitive structures have a same number of switching positions, preferably equal to three.

According to an embodiment, the switching positions are towards common nodes.

According to an embodiment, the additional capacitors are further connected to one or a plurality of additional nodes, the circuit being configured so that the, or each of, the additional nodes is taken to a fixed potential during at least one phase of switching of the capacitive structures.

According to an embodiment, the capacitive structures have numbers of capacitors equal to 1, to integer multiples or to integer powers of 2.

According to an embodiment, each of all the integer powers of 2 smaller than a given value is the number of capacitors of a single one of the capacitive structures.

According to an embodiment, the circuit further comprises a comparator, said one or plurality of nodes being an input node of the comparator.

An embodiment provides an analog-to-digital converter comprising the above-defined circuit.

According to an embodiment, the converter is of successive approximations register type.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF ILLUSTRATIVE EMBODIMENTS

Figure 1:
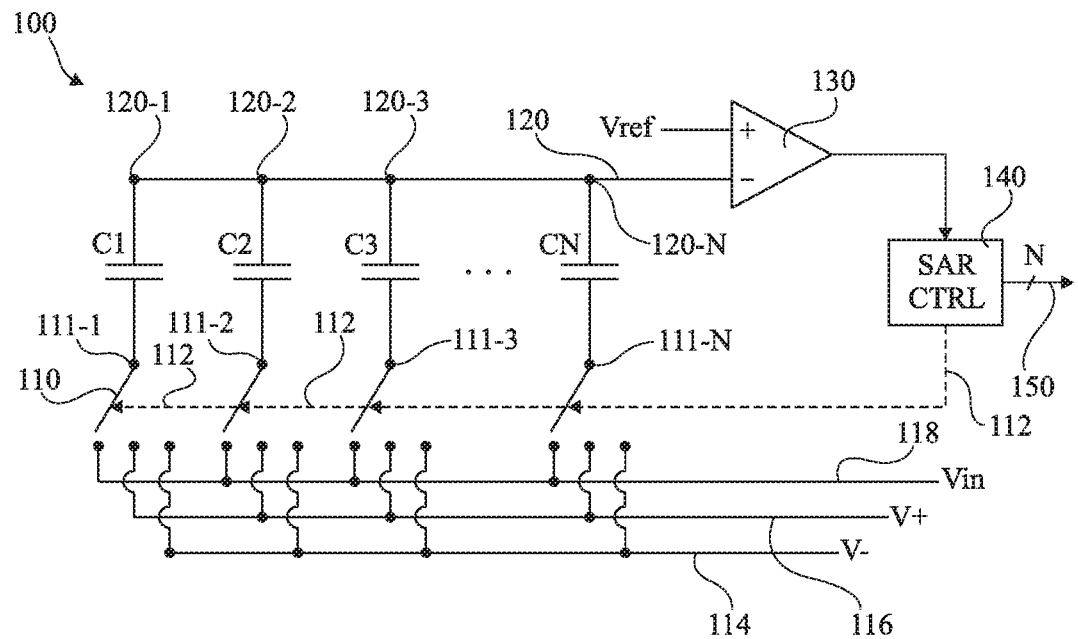
FIG. 1 schematically shows an example of a circuit of the type to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, an analog-to-digital converter control circuit is not shown, the described embodiments being compatible with usual analog-to-digital converter control circuits.

Throughout the present disclosure, the term "connected" is used to designate a direct electrical connection between circuit elements, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 schematically shows an example of a circuit 100 of the type to which the described embodiments apply. More particularly, in the present example, circuit 100 is an analog-to-digital converter, preferably of successive approximations register type (SAR). This example is not limiting, and the described embodiments are compatible with all types of circuits comprising capacitive structures with weighted capacitance values.

Circuit 100 comprises capacitive structures Ck, for example, a number N of capacitive structures C1, C2, C3, ... CN, k being an integer in the range from 1 to N. The number N is for example greater than or equal to 3, preferably greater than or equal to 4, more preferably greater than or equal to 6, and even more preferably greater than or equal to 8. Capacitive structures Ck have weighted capacitance values. For example, the capacitance value of capacitive structure C1 is the unit value. Thus, the capacitance values of the other capacitive structures Ck (k different from 1) are integer multiples of that of capacitive structure C1.

In the shown example, the capacitance values of the capacitive structures other than structure C1 are integer powers of 2, multiplied by the capacitance value of capacitive structure C1. Preferably, each capacitive structure Ck has a capacitance equal to $2^{k-1}$ times that of capacitive structure C1, in other words, each integer power of two smaller than or equal to $2^{N-1}$ is the capacitance value of one and only one of capacitive structures Ck. This example is not limiting, and the described embodiments are compatible with circuits comprising a plurality of structures having same weighted capacitance values and/or capacitive structures having capacitance values different from a unit value multiplied by an integer power of 2.

In the shown example, capacitive structures Ck are switchable, that is, each capacitive structure Ck has a terminal, or node, 111-k (111-1, 111-2, 111-3, ..., 111-N) coupled, preferably connected, to a switch 110. Each switch 110 is configured to connect the concerned capacitive structure to a plurality of nodes one by one according to a control signal 112. Switches 110 enable to switch capacitive structures Ck towards three same nodes 114, 116, and 118. In other words, the switchable capacitive structures have three switching positions respectively towards nodes 114, 116, and 118. This example is not limiting, the described embodiments being compatible with circuits comprising switchable capacitive structures having any same number of switching positions, with circuits comprising switchable capacitive structures having different numbers of switching positions, and with circuits comprising, or further comprising, non-switchable capacitive structures.

Nodes 114, 116, and 118 are here common and form nodes of application of respective potentials V−, V+, and Vin. However, the described embodiments are compatible with circuits where the capacitive structures are switchable towards different nodes for the different capacitive structures.

In the shown example, capacitive structures Ck have terminals 120-k (120-1, 120-2, 120-3, ..., 120-N) connected together to a same node 120. This is not limiting, and the described embodiments are compatible with circuits comprising capacitive structures having their terminals 120-k forming different nodes 120-k, or comprising groups of capacitive structures having their terminals 120-k connected together in each group, and forming different nodes between groups. The different nodes 120-k may then be coupled together by capacitive structures, for example having weighted capacitance values.

The analog-to-digital converter further comprises a comparator 130. Node 120 corresponds to an input of comparator 130, the inverting input in the present example. The comparator may comprise another input, for example, non-inverting, coupled to a node of application of a voltage Vref.

The analog-to-digital converter further comprises a control circuit 140 (SAR CTRL). Control circuit 140 receives the output of comparator 130 and controls the switches 110 of capacitive structures Ck.

In operation, control circuit 140 deduces a digital value 150, for example of N bits, from an analog value corresponding to potential Vin. To achieve this, during a conversion phase, control circuit 140 controls successive positions of switches 110. The successive positions of switches 110 are not described in detail herein, the described embodiments being compatible with the successive positions of switches of a usual analog-to-digital converter, such as a converter of successive approximations register type.

Figure 2:
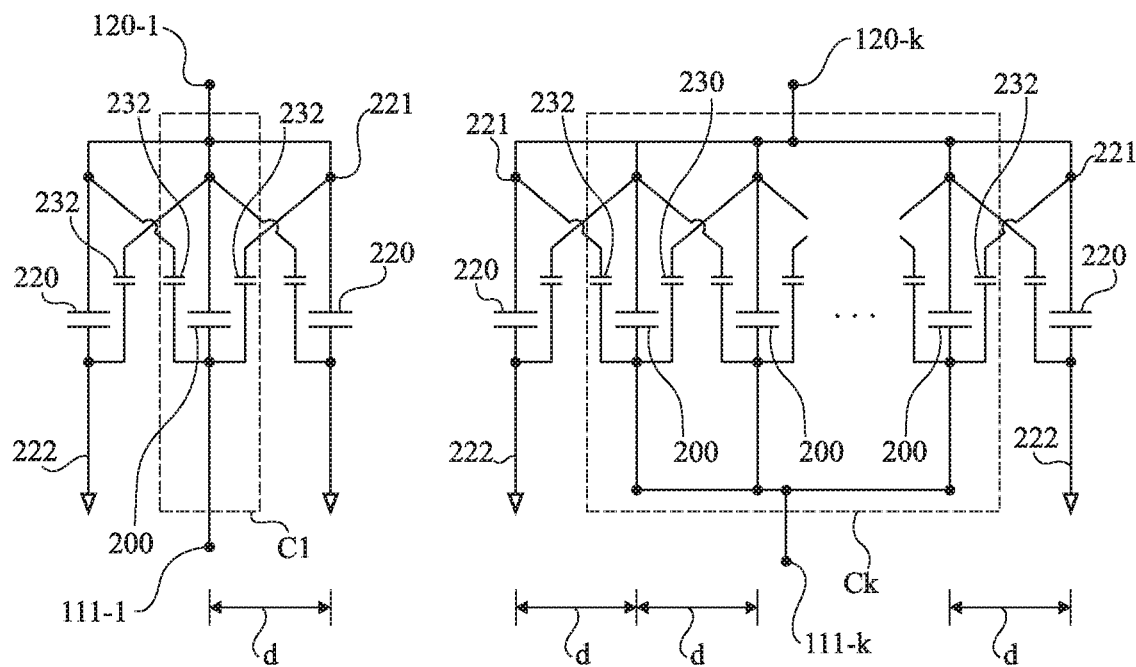
FIG. 2 schematically shows an embodiment of capacitive structures.

FIG. 2 schematically shows an embodiment of capacitive structures of a circuit. More particularly, FIG. 2 shows an embodiment of capacitive structure C1 (in the left-hand portion) and of one of capacitive structures Ck (in the right-hand portion) of a circuit of the type of circuit 100 of FIG. 1. Although capacitors and stray capacitances separated from the capacitors having been shown in FIG. 2, the stray capacitances comprise no additional element with respect to those of the capacitors. Only stray capacitances involved in the capacitance values presented by the capacitive structures Ck between their terminals are represented and detailed.

Capacitive structure C1 is formed of a capacitor 200. Capacitive structures Ck, for k greater than 1, are each formed of an integer number, preferably equal to $2^{k-1}$, of capacitors 200 connected in parallel between nodes 111-k and 120-k. A capacitive structure is here said to be formed or defined by a capacitor 200 or by a plurality of capacitors 200 in parallel, when this or these capacitor(s) 200 constitute(s), apart from possible stray capacitances, the entirety of the capacitor units of the circuit in parallel between the terminals of the capacitive structure. Preferably, this or these capacitor(s) 200 constitute(s) the entirety of the capacitors of the circuit in parallel between the terminals of the capacitive structure. In other words, the circuit comprises, apart from capacitor(s) 200 that form the capacitive structure and possible stray capacitances, no other capacitor unit connected in parallel with capacitor(s) 200 and, preferably, no other capacitor connected in parallel with capacitor(s) 200. In other words, the capacitive structure has, between its nodes 111-k and 120-k, a capacitance value equal to that of capacitor 200 or to the sum of the values of capacitors 200 which form the structure, to within possible stray capacitances.

Capacitors 200 are capacitor units. Capacitor units are capacitors having the same capacitance values in the absence of possible stray capacitances. Preferably, the capacitor units are all identical, to within the manufacturing tolerance. In this example, the capacitor units 200 of capacitive structure Ck are regularly repeated with a pitch d.

In practice, stray capacitances 230 are caused by neighboring capacitor units 200. Two capacitors which are immediately next to each other, or adjacent, that is, separated by no other capacitor unit, preferably by no other capacitor, are called neighboring capacitors. In other words, the distance between centers of neighboring capacitor units 200 is equal to pitch d. Each stray capacitance 230 is formed between an electrode connected to terminal 111-$k$ of one of capacitors 200 and an electrode connected to terminal 120-$k$ of a neighboring capacitor. The values of the stray capacitances increase as distance d between capacitors decreases.

Additional capacitors 220, not comprised among the capacitors forming capacitive structures Ck, are connected to nodes 120-1 and 120-$k$. In other words, the additional capacitors 220 are not connected in parallel with the capacitors 200 forming structures Ck. Preferably, additional capacitors 220 are capacitor units identical, to within the manufacturing tolerance, to the capacitor units 200 of capacitive structures Ck.

Additional capacitors 220 are, in this example, located at a same distance on either side of the capacitor of capacitive structure C1, and on either side of the capacitors 200 of capacitive structure Ck. Preferably, this distance is the same as the distance between neighboring capacitors 200 in weighted capacitive structure Ck. Thus, stray capacitances 232, of same values as stray capacitances 230, are located between additional capacitors 220 and the capacitors 200 of capacitive structures C1 and Ck.

In the present example, in each capacitive structure C1 or Ck, each of capacitors 200 has two neighbors among the capacitors 200 of capacitive structures Ck and additional capacitors 220. In other words, each capacitor C1 or Ck has two capacitors located at a distance therefrom equal to distance d.

Each additional capacitor 220 has a terminal 221 connected to one of nodes 120-1 and 120-$k$. More particularly, the nodes 120-1, 120-$k$ of each capacitive structure C1, Ck are connected to the terminals 221 of the additional capacitors adjacent to the capacitive structure. Thus, due to the fact that the additional capacitors 220 adjacent to structure C1 have their terminals 221 connected to node 120-1, the value of the capacitance of capacitive structure C1 between terminals 111-1 and 120-1 is formed of those of capacitor 200 of capacitive structure C1 and of two stray capacitances 232. Indeed, the capacitor 200 of capacitive structure C1 and the two stray capacitances 232 are then electrically in parallel between terminals 111-1 and 120-1. Similarly, the capacitance value of capacitive structure Ck is the sum of the values of capacitors 200 of capacitive structure Ck and, for each capacitor 200, of two stray capacitances. In other words, the number of stray capacitances per capacitor is equal to 2 in capacitive structure C1 and in capacitive structure Ck. This number is thus the same in capacitive structure C1 and in capacitive structure Ck. In particular, in the preferred case where capacitive structure Ck comprises 2k−1 capacitor units, capacitive structure Ck has, between nodes 111-$k$ and 120-$k$, a value equal to 2k−1 times that of capacitive structure C1, whatever the value of the stray capacitances. For example, the value of each stray capacitance may be in the range from 1 to 5% of the value of capacitor units 200 and 220.

It could have been devised to obtain a value of capacitive structure Ck equal to 2k−1 times that of capacitive structure C1 without providing additional capacitors 220, or without coupling additional capacitors 220 to nodes 120-1 and 120-$k$. However, capacitive structure C1 would then have exhibited between its terminals the value of its capacitor unit 200 only, while, in capacitive structure Ck, the values of stray capacitances 230 would have added to the sum of the values of the 2k−1 capacitor units 200. This would have resulted in a problem of accuracy of the weighted capacitances values of the capacitive structures. In a converter such as that of FIG. 1, this would have resulted in problems of accuracy of the conversion, in particular, in linearity issues. The values of the stray capacitances would then have had to be limited, for example, by drawing the capacitor units away from each other, to the detriment of the converter bulk.

By comparison, the provision of additional capacitors 220 connected to nodes 120-1, 120-$k$, and positioned as described hereabove enables to improve the accuracy and/or to decrease the bulk of capacitive structures Ck. In particular, an analog-to-digital converter comprising such additional capacitors 220 is more accurate and/or more compact than a converter deprived of such additional capacitors.

Preferably, additional capacitors 220 each have a terminal 222 coupled, preferably connected, to a node of application of a fixed potential, preferably the ground. This potential is fixed during at least a phase of switching of capacitive structures Ck. Such a phase preferably comprises the switching of all the switchable capacitive structures among capacitive structures Ck, that is, in the example of the circuit of FIG. 1, the switching of all capacitive structures Ck. Preferably, this phase is a phase of conversion of an analog value into a digital value. Preferably, potentials Vref, V+, and V− (FIG. 1) are then selected so that the analog-to-digital conversion is performed from a selected range of potential Vin.

The preferred example of terminals 222 coupled to ground is not limiting. The different terminals 222 may be coupled to different nodes of application of different fixed potentials. As a variation, for at least part of additional capacitors 220, the terminal 221 of each additional capacitor is connected to terminal 222 (and thus to one of terminals 120-$k$). The potential of terminal 222 can then not be fixed during the switching phase.

Capacitive structures C1 and Ck having their capacitors 200 aligned with a regular pitch d has been described hereabove in relation with FIG. 2. However, preferably, capacitors 200 occupy locations of an array. Additional capacitors 220 are then provided at other locations of the array, as described hereafter in relation with the following drawings.

Figure 3:
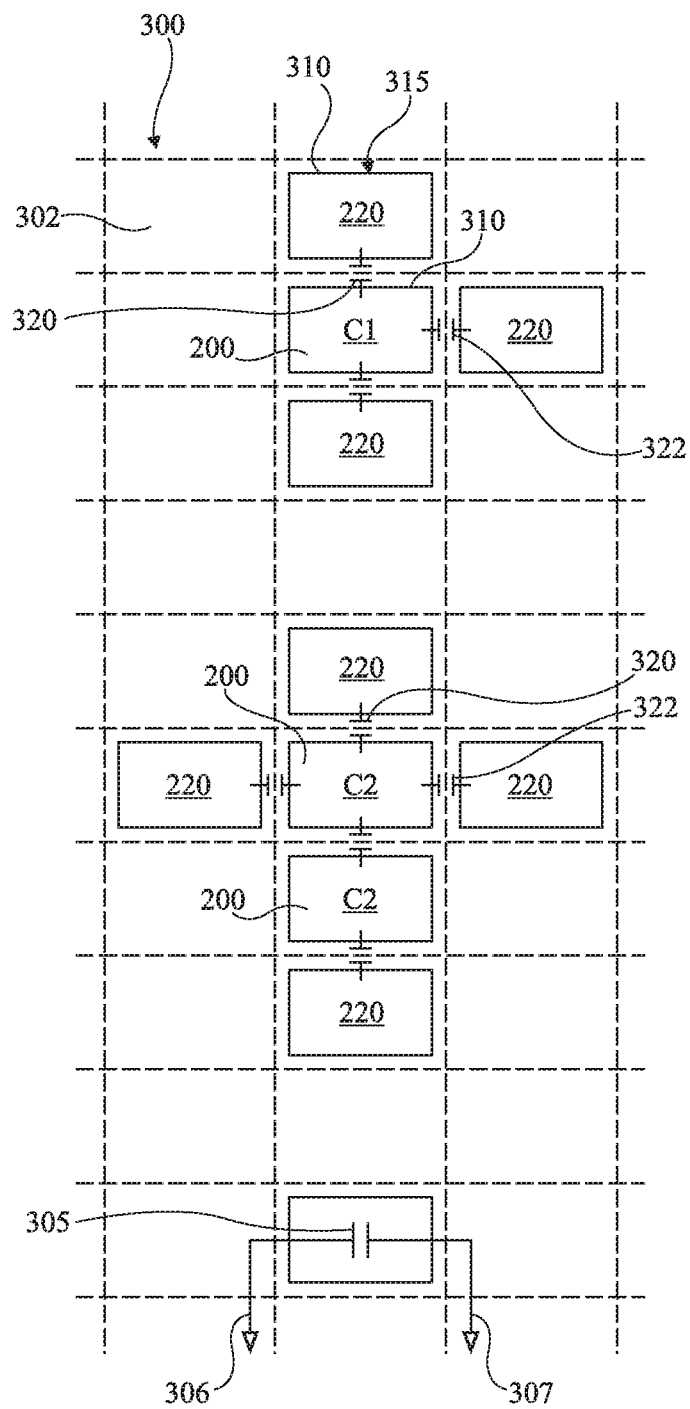
FIG. 3 schematically shows a top view of another embodiment of capacitive structures.

FIG. 3 schematically shows a top view of an embodiment of capacitive structures of a circuit. More particularly, structures C1 and C2, which may be those of the circuit of FIG. 1, have been shown.

Capacitors 200 and 220 are identical capacitor units. Capacitors 200 and 220 occupy certain locations 302 of an array 300. One or a plurality of other locations of array 300, for example, all the other locations of array 300, are occupied by capacitors 305. The two terminals 306, 307 of each capacitor 305 are coupled, preferably connected, together to a same node of application of a fixed potential such as the ground. Capacitors 305 are connected to node of nodes 120-1 and 120-2. Further, apart from capacitors 200 and 220 and possible stray capacitances, the circuit comprises no other capacitor located in a location of the array and connected to one of node 120-1 and node 120-2. In other words, all the capacitor units of the circuit located in the array and connected to nodes 120-1 and/or 120-2 are among the capacitors 200 of the capacitive structures and additional capacitors 220.

In this example, capacitors 200 and 220 occupy rectangular locations, that is, the array has different pitches in the row direction of the array and in the column direction of the array. As a result, the stray capacitances between neighbors of a same row may be different from the stray capacitances between neighbors of a same column. As an example, the pitches in the column direction and in the row direction are in the range from 0.1 µm to 1.5 µm.

Preferably, each capacitor unit 200, 220 comprises an electrode 310. Preferably, another electrode 315 of the capacitor unit is entirely located under electrode 310, that is, hidden by electrode 310 in top view. Each capacitor unit occupies a central portion of one of locations 302. Preferably, the capacitor unit occupies the major part of the location. For example, the distance separating two neighboring capacitors of a same row and/or of a same column amounts to from 5% to 25% of the distance between the centers of the neighboring capacitors. Stray capacitances 320, similar to stray capacitances 230 (FIG. 2), appear between neighboring capacitors of a same column. Similarly, stray capacitances 322 appear between neighboring capacitors of a same row, or line of the matrix.

In the shown example, in the column direction, two additional capacitors 220 have been provided on either side of capacitor 200 of capacitive structure C1, and two additional capacitors 220 have been provided on either side of capacitors 200 of capacitive structure C2. Thus, in the column direction, in each capacitive structure C1 or C2, each capacitor 200 has, among the capacitors 200 of the capacitive structures and additional capacitors 220, two neighboring capacitors in the column direction. Each capacitor 200 of each capacitive structure is thus associated with two stray capacitances 320. Thus, capacitive structure C2 comprises twice as many stray capacitances 320 as capacitive structure C1.

In the row direction, capacitor 200 of capacitive structure C1 has a single neighbor. Capacitive structure C2 comprises a capacitor 200 which has two neighbors in the row direction and a capacitor 200 having no neighbor in the row direction. In other words, although the two capacitors 200 do not have the same number of neighboring capacitors in the row direction, the average of the numbers of neighboring capacitors in the row direction is equal to 1. Thus, in average, each capacitor 200 of capacitive structure C2 is associated with the same number of stray capacitances 322 as the capacitor 200 of capacitive structure C1.

Capacitive structure C1 thus has, between its terminals 111-1 and 120-1 (FIG. 2), a capacitance value equal to that of capacitor unit 200, plus one stray capacitance 322 and two stray capacitances 320. Whatever the values of stray capacitances 320 and 322, capacitive structure C2 has between terminals 111-2 and 120-2 a value equal to twice the value of capacitive structure C1 between terminals 111-1 and 120-1.

In a capacitive structure Ck comprising more than two capacitor units, it is provided to position additional capacitors 220 in a same way as in the example of FIG. 2 of capacitive structures with one or two capacitor units.

Thus, in the case of a circuit comprising capacitive structures Ck, a first value equal to the number of neighbors of this capacitor in the row direction is defined for each capacitor 200 of capacitive structures Ck. More particularly, the neighbors of each capacitor 200 are among all the capacitors 200 of the structures and additional capacitors 220. In capacitive structure Ck, the first values have an average equal to the number of neighboring capacitors, in the row direction, of the capacitor 200 of capacitor structure C1.

A second value equal to the number of capacitors which, among all the capacitors 200 and 220, are neighbors to the considered capacitor 200 in the column direction, are defined for each capacitor 200 of capacitive structures Ck. In capacitive structure Ck, the second values have an average equal to the number of neighboring capacitors, in the column direction, of capacitor 200 of capacitive structure C1.

The accuracy and/or the bulk of the circuit comprising capacitive structure Ck have thus been improved over a circuit comprising no additional capacitors.

Examples of circuits comprising a capacitive structure C1 defined by a single capacitor unit have been described hereabove. This is not limiting, and capacitor structure C1 may comprise a plurality of capacitor units 200. The number and the positions of additional capacitors 220 are then selected so that the first values have a same average in the different capacitive structures Ck and so that the second values have a same average in the different capacitive structures Ck.

Although capacitive structures having, for each capacitor 200, in average two neighboring capacitors in the column direction and one neighboring capacitor in the row direction have been described hereabove, these averages may take any value smaller than or equal to two.

In the above example, the numbers of neighbors in the row direction and the numbers of neighbors in the column direction have been taken into account. This is not limiting. According to embodiments, only the numbers of neighbors in the row direction or only the number of neighbors in the column direction are taken into account. According to other embodiments, the numbers of neighbors along diagonals of the array are further taken into account. At least one third value equal, for each capacitor, to the number of a diagonal neighbors of the capacitor, are then defined in the same way as the above first and second values.

An array having different pitches in the row direction and in the column direction has been described hereabove. This is not limiting and the array may have a same pitch in the row and column direction. Stray capacitances 320 and 322 then preferably have equal values. The number and the position of additional capacitors 220 are selected so that, if a value equal to the number of neighboring capacitors is defined for each capacitor 200 of the capacitive structures, the average of the values thus defined is the same in the different capacitive structures. The neighboring capacitors are here in any direction among the column direction and the row direction.

The preferred above example of capacitors located at locations of an array is not limiting. Indeed, in the above example, distances between neighbors (from center to center) corresponding to the pitches in the respective row and columns directions may be defined. In the case, for example, of an array having a same pitch in the row and column directions, a single distance between neighbors corresponding to this same pitch may be defined. Similarly, for capacitors which are not located at locations of an array, one or a plurality of distances between neighboring capacitors are defined. Thus, for this distance, or each of these distances, if, for each capacitor 200, a value equal to the number of capacitors located at this distance from the considered capacitor 200 is defined, the values thus defined have a same average in each capacitive structure Ck.

The fact of providing additional capacitors 220 arranged and connected as described hereabove enables, as mentioned in relation with FIG. 2, to optimize the accuracy and/or the bulk of capacitive structures Ck. Further, according to an advantage, due to the fact that the additional capacitors 220 neighboring the capacitors 200 of one of the capacitive structures Ck are connected to a same node 120-$k$ as capacitors 200, it is avoided to run conductors between capacitors and/or above the capacitors. The pitches of the array can thus be decreased without risking deteriorating the accuracy by additional stray capacitances between the conductors and the capacitors.

As an example, as compared with an analog-to-digital converter comprising no additional capacitors, about 40% of the surface area occupied by the capacitive structures may be saved in a particular example of ratio between the values of stray capacitance and capacitor unit. As an example, in a 12-bit analog-to-digital converter, such a surface area decrease may be obtained with a linearity error smaller than 8% of the least significant bit.

Figure 4:
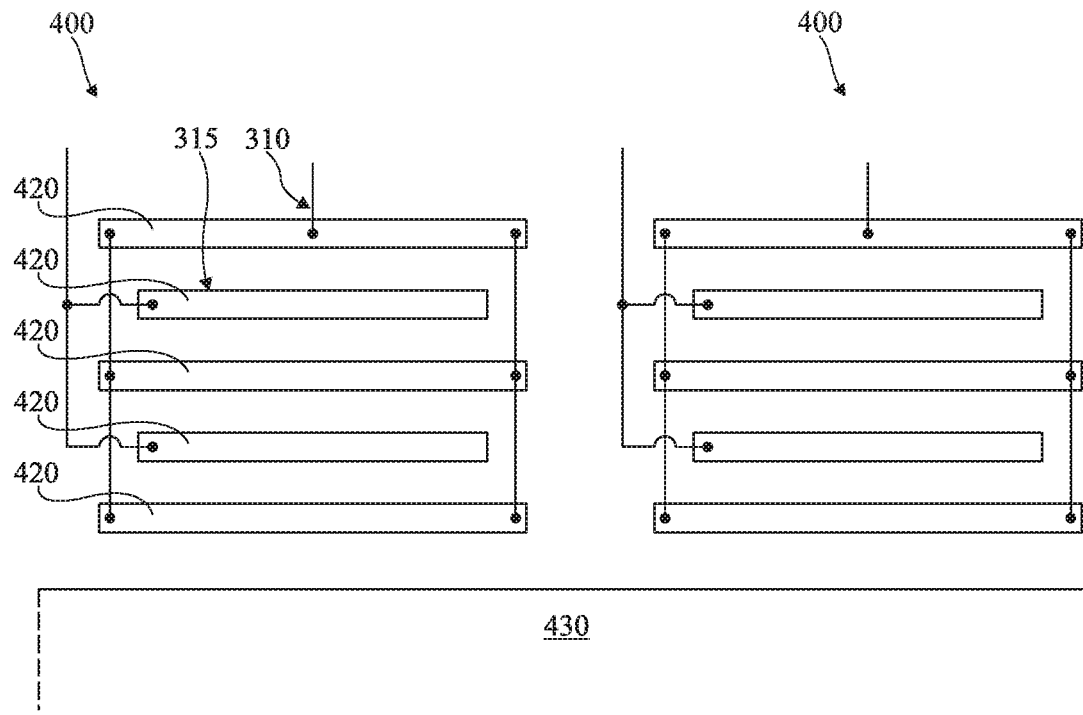
FIG. 4 shows a partial simplified cross-section view of two examples of neighboring capacitor units 400.

FIG. 4 shows a partial simplified cross-section view of two neighboring capacitor units 400. In particular, the connections are represented in a very simplified way. Each of capacitors 400 may form any of the capacitors 200 of capacitive structures Ck and of the additional capacitors 220 of the described embodiments.

Capacitors 400 are identical, to within manufacturing tolerances. Each of capacitors 400 comprises a stack of metal plates 410 alternating with metal plates 420. The alternated plates are separated by dielectric layers, not shown. Each capacitor comprises a plurality of interconnected electrically-conductive plates 410, thus forming an electrode 310. Preferably, the two lower and upper plates of the stack are first plates 410. Then, first plates 410 are preferably coupled, for example connected, to terminal 222 (FIG. 2) of application of a fixed potential, such as the ground. Lower and upper plates 410 of the stack thus form a shielding of electrode 420 allowing stray capacitances to be reduced. Each capacitor preferably comprises a plurality of interconnected second metal plates 420, thus forming an electrode 315.

Preferably, metal plates 410 and 420 are each formed in a metal level above a substrate 430, for example, a semiconductor substrate such as silicon. The metal levels are defined by layers comprising conductors (not shown) between components such as transistors located inside and on top of the substrate. The conductors are surrounded with insulators and located between insulator layers. The substrate is for example a semiconductor wafer defining, with the elements located inside and on top of the semiconductor wafer, an electronic integrated circuit chip.

An advantage of capacitor units 400 is that they may be simply formed, simultaneously to the forming of the metal levels of the chip.

Figure 5:
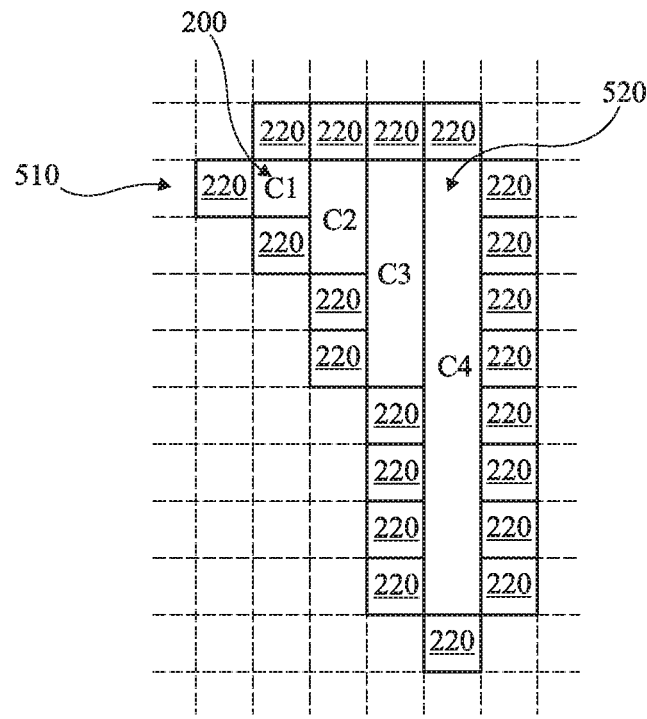
FIG. 5 schematically shows a top view of an embodiment of four capacitive structures.

FIG. 5 schematically shows a top view of an embodiment of four capacitive structures C1, C2, C3, and C4. More particularly, capacitive structure C1 is defined by a capacitor unit 200, and capacitive structures C2, C3, and C4 are respectively defined by 2, 4, and 8 capacitor units 200 electrically connected in parallel. Capacitors 200 are not individually shown, the portions of the array occupied by capacitors 200 being shown. The locations which are not occupied by one of the capacitors 200 of the capacitive structures or one of additional capacitors 220 are shown in dotted lines.

The capacitors 200 of capacitive structures C1, C2, C3, and C4 each occupy a column of the array. The columns occupied by capacitive structures C1, C2, C3, and C4 are located side by side in the order of capacitive structures C1, C2, C3, and C4. In each column, the occupied locations are adjacent and extend from a same row 510. The locations occupied by the capacitors 200 of the capacitive structures define a central portion 520 of the array.

Thus, all the locations of central portion 520 are occupied by capacitors 200. Preferably, the central portion is full, that is, each of its locations is occupied by a capacitor among the capacitors 200 of the capacitive structures and additional capacitors 220.

Additional capacitors 220 occupy all the locations neighboring, or adjacent to, the central portion. Thus, each capacitor 200 has two neighbors in the row direction and two neighbors in the column direction. In the case of an array having same pitches in the row and column directions, each capacitor 200 has four neighbors. As mentioned hereabove, an increased accuracy with respect to a circuit comprising no additional capacitors 200 is thus obtained.

Figure 6:
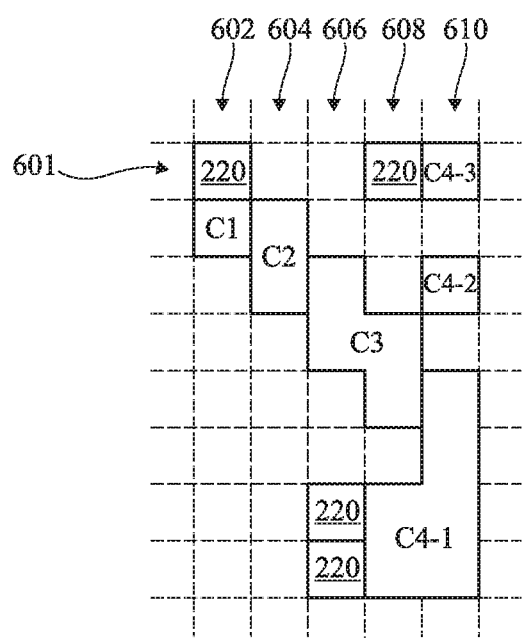
FIG. 6 schematically shows a top view of another embodiment of four capacitive structures.

FIG. 6 schematically shows a top view of another embodiment of four capacitive structures C1, C2, C3, and C4. The capacitive structures are, as those of FIG. 5, defined by respectively 1, 2, 4, and 8 capacitor units occupying locations of an array.

The array successively comprises, from a same row 601:
a column 602 successively comprising an additional capacitor 220, capacitor 200 of structure C1, and a capacitor-less location;
a column 604 successively comprising a capacitor-less location, the two capacitors 200 of structure C2, and a capacitor-less location;
a column 606 successively comprising two capacitor-less locations, two of the capacitors 200 of structure C3, two capacitor-less locations, and two additional capacitors 220;
a column 608 successively comprising an additional capacitor 220, two capacitor-less locations, the two others of capacitors 200 of structure C3, one capacitor-less location, and two of the capacitors 200 of structure C4 (C4-1); and
a column 610 successively comprising one of the capacitors 200 of structure C4 (C4-3), one capacitor-less location, one of the capacitors 200 of structure C4 (C4-2), one capacitor-less location, and the four other capacitors 200 of structure C4.

The capacitor-less locations may optionally comprise capacitors 305, not shown such as defined in relation with FIG. 3.

Thus, in each capacitive structure, the average of the values defined, for each capacitor, by the number of neighbors of the capacitor in the row direction, is equal to 1. These averages are thus equal. In each capacitive structure, the average of the values defined, for each capacitor, by the number of neighbors of the capacitor in the column direction, is equal to 1. These averages are thus equal.

As mentioned hereabove, an increased accuracy with respect to a circuit comprising no additional capacitors 220 is obtained. Further, as compared with the assembly of the capacitive structures and of the additional capacitors of FIG. 5, the assembly of the capacitive structures and of the additional capacitors of FIG. 6 is more compact.

In the case of an array having same pitches in the row and column directions, in each capacitive structure, the average of the values defined, for each capacitor, by the number of neighbors of the capacitor, is equal to 2. These values are thus equal, which provides, in this case also, an increased accuracy and a decreased bulk.

Figure 7:
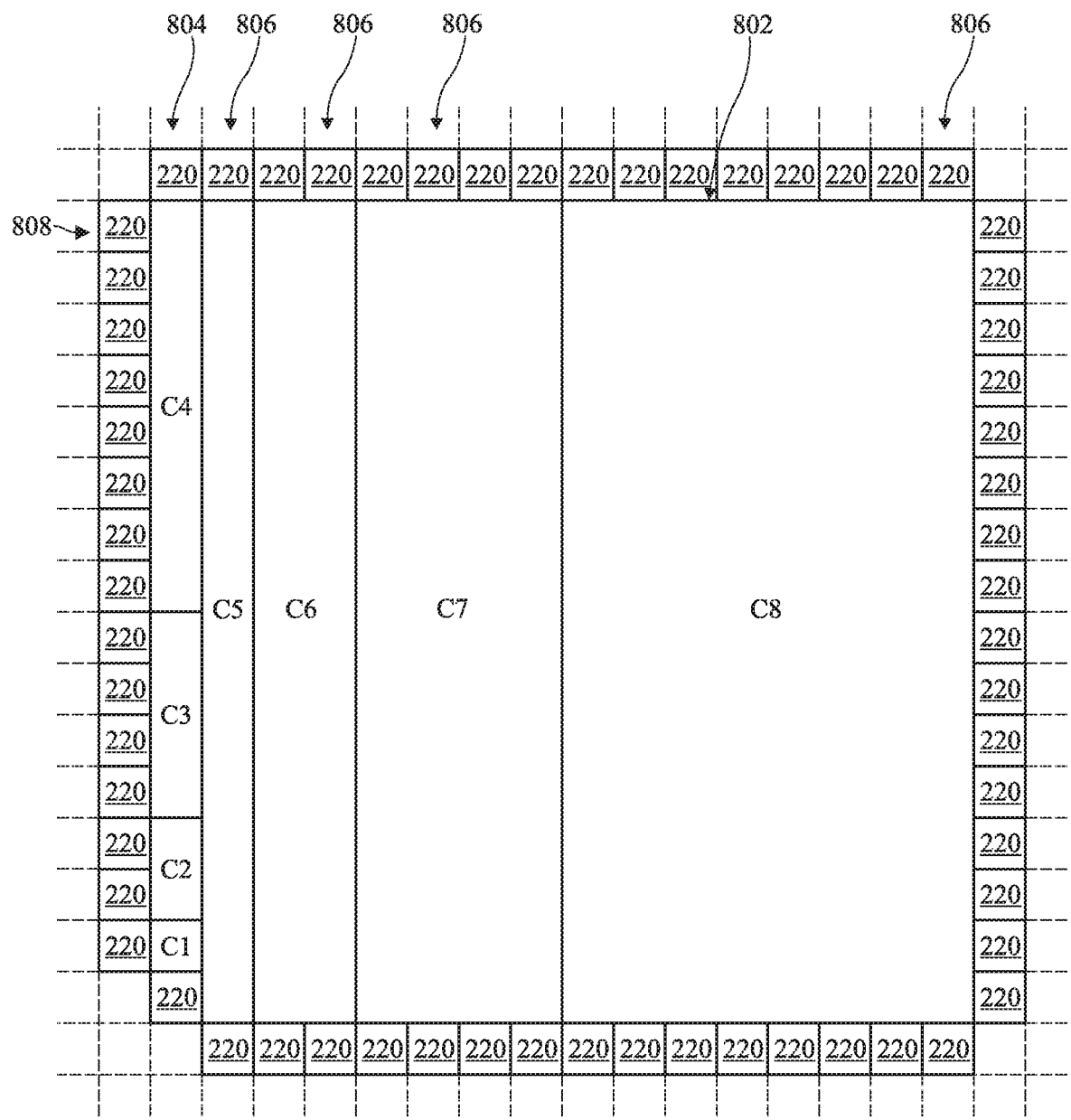
FIG. 7 schematically shows a top view of an embodiment of eight capacitive structures.

FIG. 7 schematically shows a top view of an embodiment of eight capacitive structures Ck, for k between 1 and 8 (C1, C2, C3, C4, C5, C6, C7, and C8). Each capacitive structure Ck is formed by 2k−1 capacitor units 200.

The capacitors of the capacitive structures occupy all the locations of a central portion 802 of the array. Central portion 802 is successively formed of one column 804 having fifteen locations from a row 808 and of fifteen columns 806 having sixteen locations from a same row 808. Column 804 successively comprises, from row 808, the eight capacitors 200 of structure C4, the four capacitors 200 of structure C3, the two capacitors 200 of structure C2, and the capacitor 200 of structure C1. Capacitors 200 of structures C5, C6, C7, and C8 respectively occupy one, two, four, and eight of columns 806.

Additional capacitors 220 occupy all the locations adjacent to central portion 802. Thus, each capacitor 200 of capacitive structures has two neighbors in the row direction, and two neighbors in the column direction. In the case of an array having same pitches in the row and column directions, each capacitive structure has four neighbors. This thus provides an increased accuracy with respect to a circuit comprising no additional capacitors.

Various embodiments and variations have been described. It will be understood by those skilled in the art that certain features of these various embodiments and variations may be combined, and other variations will occur to those skilled in the art.

Finally, the practical implementation of the described embodiments and variations is within the abilities of those skilled in the art based on the functional indications given hereabove.

What is claimed is:

1. An electronic circuit, comprising:
   capacitive structures connected to one or a plurality of nodes, wherein each of the capacitive structures is formed by a capacitor or by a plurality of capacitors electrically connected in parallel, wherein the capacitive structures are switchable; and
   additional capacitors, wherein each additional capacitor is connected to the one or plurality of nodes;
   wherein, for at least one distance between capacitors, the capacitive structures have a same average of values defined, for each capacitor of each capacitive structure, by a number of capacitors of the electronic circuit connected to the one or plurality of nodes and located at the distance from the capacitor of the capacitive structure.

2. The electronic circuit of claim 1, wherein the capacitors of the capacitive structures and the additional capacitors are capacitor units.

3. The electronic circuit of claim 1, wherein the capacitors of the capacitive structures and the additional capacitors are located in locations of an array.

4. The electronic circuit of claim 3, wherein the capacitors of the capacitive structures occupy all the locations of a central portion of the array, and the additional capacitors occupy all the locations adjacent to the central portion of the array.

5. The electronic circuit of claim 3, wherein the at least one distance comprises a distance between neighboring capacitors of a column of the array and/or a distance between neighboring capacitors of a row of the array.

6. The electronic circuit of claim 3, wherein the at least one distance is a same distance between neighboring capacitors of a row of the array and between neighboring capacitors of a column of the array.

7. The electronic circuit of claim 1, wherein the capacitive structures have a same number of switching positions.

8. The electronic circuit of claim 7, wherein the number of the switching positions is equal to three.

9. The electronic circuit of claim 7, wherein the switching positions are towards common nodes.

10. The electronic circuit of claim 1, wherein the additional capacitors are further connected to one or a plurality of additional nodes, and wherein the electronic circuit is configured so that each additional node is taken to a fixed potential during at least one phase of switching of the capacitive structures.

11. The electronic circuit of claim 1, wherein the capacitive structures have numbers of capacitors equal to 1, to integer multiples, or to integer powers of 2.

12. The electronic circuit of claim 11, wherein each of the integer powers of 2 smaller than a given value is a number of capacitors of a single one of the capacitive structures.

13. The electronic circuit of claim 1, further comprising a comparator, wherein the one or plurality of nodes is an input node of the comparator.

14. The electronic circuit of claim 1, wherein the electronic circuit is an analog-to-digital converter.

15. The electronic circuit of claim 14, wherein the analog-to-digital converter is a successive approximations register type analog-to-digital converter.

16. The electronic circuit of claim 1, wherein the one or plurality of nodes comprises a plurality of separate nodes.

17. The electronic circuit of claim 16, wherein each capacitive structure is connected to a respective separate node.

18. The electronic circuit of claim 17, wherein the separate nodes are coupled together by additional capacitive structures.

19. The electronic circuit of claim 18, wherein each of the additional capacitive structures has a weighted capacitance value.

20. The electronic circuit of claim 16, further comprising a plurality of groups of the capacitive structures, wherein each of the groups of the capacitive structures is connected to a respective separate node.

21. The electronic circuit of claim 20, wherein the separate nodes are coupled together by additional capacitive structures.

22. The electronic circuit of claim 21, wherein each of the additional capacitive structures has a weighted capacitance value.

23. An electronic circuit, comprising:
   capacitive structures connected to one or a plurality of nodes, wherein each of the capacitive structures is formed by a capacitor or by a plurality of capacitors electrically connected in parallel; and
   additional capacitors, wherein each additional capacitor is connected to the one or plurality of nodes;
   wherein the capacitors of the capacitive structures and the additional capacitors are capacitor units; and
   wherein, for at least one distance between capacitors, the capacitive structures have a same average of values defined, for each capacitor of each capacitive structure, by a number of capacitors of the electronic circuit connected to the one or plurality of nodes and located at the distance from the capacitor of the capacitive structure.

24. An electronic circuit, comprising:

capacitive structures connected to one or a plurality of nodes, wherein each of the capacitive structures is formed by a capacitor or by a plurality of capacitors electrically connected in parallel;

additional capacitors, wherein each additional capacitor is connected to the one or plurality of nodes; and a comparator, wherein the one or plurality of nodes is an input node of the comparator;

wherein, for at least one distance between capacitors, the capacitive structures have a same average of values defined, for each capacitor of each capacitive structure, by a number of capacitors of the electronic circuit connected to the one or plurality of nodes and located at the distance from the capacitor of the capacitive structure.

* * * * *